United States Patent [19]
Lee

[11] Patent Number: 5,296,397
[45] Date of Patent: Mar. 22, 1994

[54] METHOD FOR MANUFACTURING AN EPROM CELL

[75] Inventor: Sangsoo Lee, Kyunki, Rep. of Korea

[73] Assignee: Goldstar Electron Co., Ltd., Seoul, Rep. of Korea

[21] Appl. No.: 51,621

[22] Filed: Apr. 22, 1993

Related U.S. Application Data

[60] Division of Ser. No. 804,478, Dec. 9, 1991, Pat. No. 5,223,731, which is a continuation-in-part of Ser. No. 708,824, May 29, 1991, abandoned, which is a continuation of Ser. No. 369,014, Jun. 20, 1989, abandoned.

[30] Foreign Application Priority Data

Jun. 30, 1988 [KR] Rep. of Korea ............... 88-7986

[51] Int. Cl.$^5$ ......................................... H01L 21/265
[52] U.S. Cl. ......................................... 437/43; 437/49
[58] Field of Search ..................... 437/43, 49, 52, 48

[56] References Cited

U.S. PATENT DOCUMENTS

| | | | |
|---|---|---|---|
| 4,668,970 | 5/1987 | Yatsuda et al. | 357/23 |
| 4,698,900 | 10/1987 | Esquivel | 437/52 |
| 4,855,800 | 8/1989 | Esquivel et al. | 357/23 |
| 5,045,490 | 9/1991 | Esquivel et al. | 437/43 |
| 5,049,515 | 9/1991 | Tzeng | 437/43 |
| 5,087,584 | 2/1992 | Wada et al. | 437/43 |
| 5,100,818 | 3/1992 | Arima et al. | 437/43 |

FOREIGN PATENT DOCUMENTS 0138517 10/1984 European Pat. Off. .

OTHER PUBLICATIONS

"A Novel Trench-Isolated Buried N+ FAMOS Transistor Suitable for High-Density EPROM's" by A. L. Esquivel et al.; pp. 146-147, 8179 I.E.E.E. Electron Device Letters EDL-Apr. 8, 1987, No. 4, New York, U.S.A.
International Electron Devices Meeting Dec. 7-10, 1986, Los Angeles, Calif.; Sponsored by Electron Devices Society of I.E.E.E. pp. 592-595.
A High-Speed 1-Mbit EPROM with a Ti-Silicided Gate by Y. Narita et al. I.E.E.E. Journal of Solid-State Circuits, vol. SC-20, No. 1, Feb. 1985, pp. 418-421.
"Technology of a New n-Channel One-Transistor EAROM Cell Called SIMOS" by A. Scheibe et al. I.E.E.E. Transactions on Electron Devices, vol. ED-24, No. 5, May 1977, pp. 600-610.

*Primary Examiner*—Olik Chaudhuri
*Assistant Examiner*—Richard A. Booth
*Attorney, Agent, or Firm*—Brumbaugh, Graves, Donohue & Raymond

[57] ABSTRACT

Disclosed is a floating gate EPROM cell wherein a trench is formed in and divides the semiconductor substrate into two portions. Separated source and drain regions are formed in one portion and contact one side of the trench region, and a control gate region is formed in the second portion and contacts the opposite side of the trench. A first insulating film covers the source, drain, trench regions and part of the control gate region, a portion of which is covered by a first polycrystalline silicon film which forms the floating gate. A second insulating layer covers the first polycrystalline silicon film and also a portion of the control gate region, which, in turn, is covered by a second polycrystalline silicon layer which extends beyond the second insulating layer into electrical contact with the control gate region. Thus, a control gate is provided both above and below the floating gate. The coupling efficiency between the control gate and the floating gate is primarily determined by the thickness of the first insulating film, which allows the second insulating film to be thicker to insure against current leakage from the floating gate and at the same time easier to deposit.

4 Claims, 4 Drawing Sheets

METHOD FOR MANUFACTURING AN EPROM CELL

RELATED APPLICATION

This application is a division of application Ser. No. 07/804,478, filed on Dec. 9, 1991, now U.S. Pat. No. 5,223,731, which is a continuation-in-part of application Ser. No. 07/708,824, filed May 29, 1991, now abandoned, which is a continuation of application Ser. No. 07/369,014, filed Jun. 20, 1989, now abandoned.

BACKGROUND OF THE INVENTION

This invention relates to an electrically erasable and reprogrammable memory cell which is implemented in CMOS polycrystalline silicon transistor technology and, more particularly, to an improved EPROM cell.

EPROM cells, which are similar in construction to field effect transistors, but additionally include a floating gate between the control gate and the control electrode of the transistor are already known. Essentially, an EPROM cell is programmed by applying certain voltages sufficient to draw electron charges through a thin insulator which become trapped in the conductive floating gate. After removing the applied voltage, the charge remains on the floating gate and leaks away only very slowly since the floating gate, which may be a thin film of polycrystalline silicon, is enveloped entirely by electrically insulating material. This condition increases the threshold voltage of the transistor, thereby rendering it cut off in response to normal read operation voltages. Hence, during reading of a transistor cell so programmed, the transistor will remain nonconductive and thus represent a high impedance between the source and drain terminals.

A known EPROM cell construction is shown in enlarged cross-section in FIGS. 1A and 1B, which respectively are sectional views taken along lines 1A—1A and 1B—1B of the FIG. 2 lay-out of the cell. In this structure, a first layer 1 of polycrystalline silicon (hereinafter sometimes called the "poly-I layer"), which serves as the floating gate, is spaced and insulated from a second polycrystalline silicon layer 2 ("poly-II layer"), which serves as the control gate, by an insulating oxide layer 4. The poly I layer is insulated from the semiconductor substrate S by a first gate oxide layer 3, and a source region 6 and a drain region 7 are formed in the substrate at opposite sides of the poly I layer (as viewed in FIG. 1B). The individual cells of the array shown in FIG. 2 are separated from each other by an oxide layer 5 deposited on the substrate.

The operation of this known EPROM cell is critically dependent on the thickness of the oxide layer 4 which separates the poly-I and poly-II layers in that it determines the coupling efficiency between the control gate and the floating gate of the cell; the thinner the insulating layer the greater the capacitance between the conductive layers. However, it is difficult to reproducibly form the interpoly layer so as to have a thickness which is optimum for coupling efficiency and which, at the same time, is of a quality to avoid current leakage from the floating gate which, of course, adversely affects the period of time that information can be stored. If the insulating layer is made thick enough to insure against current leakage, the capacitance between the control gate and floating gate is correspondingly smaller with the consequence that higher voltages, or longer programming times, are required to trap sufficient electrons in the floating gate.

From the foregoing, it can be seen that a need exists for an EPROM cell and memory array whose operation is less dependent than known devices on the thickness of the insulating layer separating the control gate and floating gate without compromising other features of the memory and is of a construction which will allow the insulating layer to be independently grown over the polycrystalline silicon film that serves as the floating gate.

SUMMARY OF THE INVENTION

Briefly, the structure of the EPROM cell according to the invention makes it possible to form the insulating layer between the control gate and the floating gate to a thickness sufficient to minimize current leakage from the floating gate while at the same time being sufficiently thin to optimize coupling efficiency between the control gate and the floating gate. More particularly, in the EPROM cell according to the invention, a trench is formed in a semiconductor substrate and filled with silicon or silicon oxide. Separated source and drain regions are formed in the substrate with both contacting one side of the trench and a control gate region is formed in the substrate and contacts the opposite side of the trench. A first oxide insulating layer is formed over the conduction channel, the trench and a portion of the control gate region, and a first polycrystalline silicon film, which serves as the floating gate, is grown over the first oxide layer. Then, a second insulating layer, which may be thicker than the first, is formed over the poly-I layer and over a portion of the control gate region formed in the substrate. A second polycrystalline silicon layer is formed over and extends laterally beyond the second insulating layer into electrical contact with the control gate region formed in the substrate.

Because the trench divides the substrate into two regions, with the control gate region disposed on one side of the trench and the source and drain regions disposed on the opposite side, the electric field produced by a positive potential applied to the control gate region would not affect the source and drain regions directly, and electrons would not flow toward the control gate region. However, by virtue of the electrical connection of the second polycrystalline silicon layer to the control gate region formed in the substrate, a like positive voltage applied to the poly-II film generates an electric field which causes electrons to gather in the space between the drain and source regions. Then, by applying a positive potential to the drain region and grounding the source region, these electrons are injected by avalanche effect through the first insulating layer into the floating gate. The injection of the electrons by this method is not affected by the thickness of the second insulating film between the floating gate and the poly-II film connected to and extending the control gate, which means that the second oxide film can be relatively thick and grown independently. Thus, the first insulating layer can be made thin to increase the capacitance and coupling efficiency between the control gate and floating gate and still prevent current leakage from the floating gate to the control gate. With increased coupling efficiency between the control gate and floating gate, the EPROM cell of the invention can be programmed with lower drain and control gate voltages than were heretofore required.

Other objects, features and advantages of the invention will become apparent, and its construction and operation better understood, from the following detailed description, taken in conjunction with the accompanying drawings.

DETAILED DESCRIPTION OF THE INVENTION

Figure 1A:
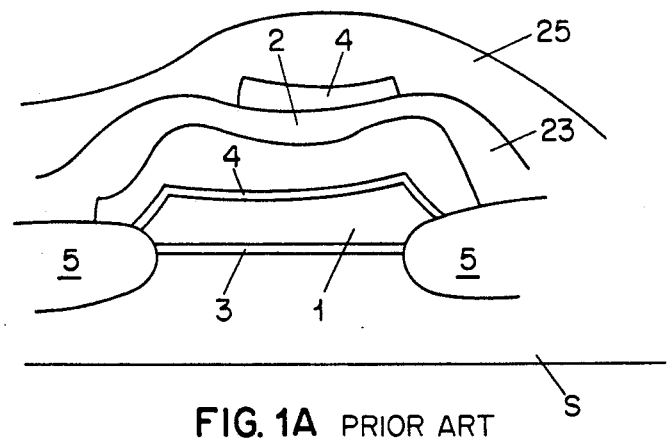
FIGS. 1A and 1B, to which reference has already been made, are enlarged sectional views of a prior art EPROM cell taken along lines 1A—1A and 1B—1B, respectively, in FIG. 2.
Figure 1B:
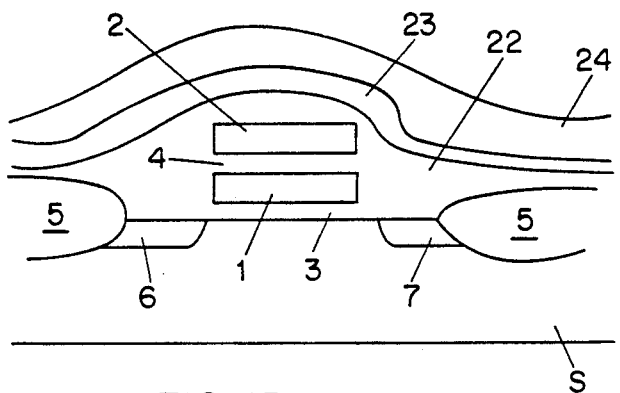
Figure 2:
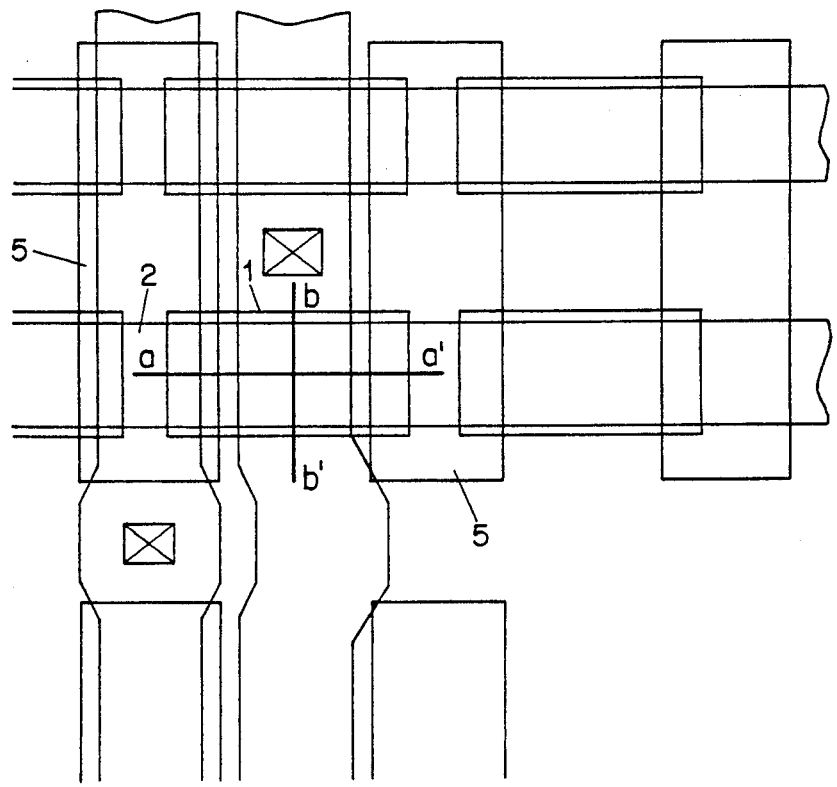
FIG. 2 is an enlarged plan view of a portion of an array of prior art EPROM cells.
Figure 3A:
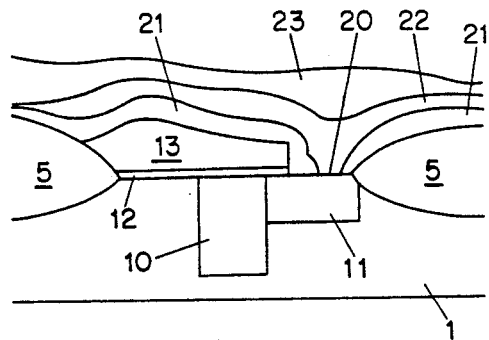
FIGS. 3A and 3B are enlarged sectional views of an EPROM cell constructed according to the invention, taken along lines 3A—3A and 3B—3B, respectively, in FIG. 4.
Figure 3B:
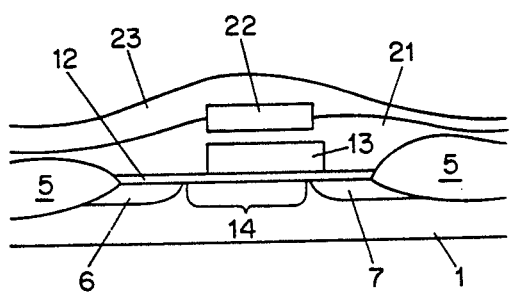
Figure 4:
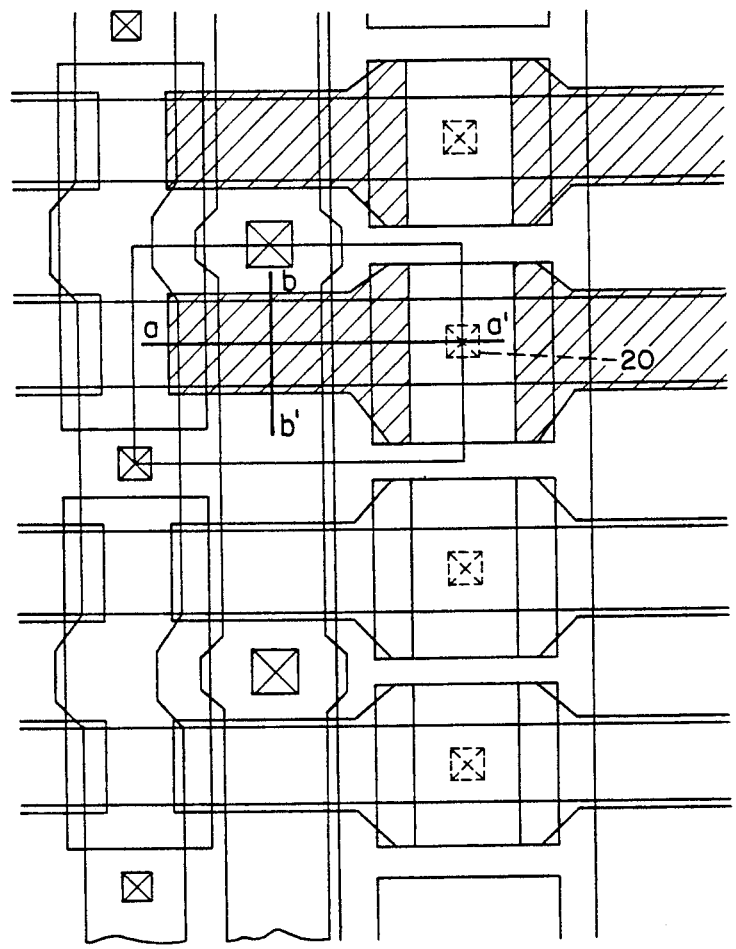
FIG. 4 is an enlarged plan view of a portion of an array of EPROM cells constructed according to the invention.

As shown in FIGS. 3A and 3B, which are orthogonally related sectional views of the improved EPROM cell, the cell is bounded by a field oxide 5 formed in a semiconductor substrate 9. The region lying between the field oxide regions 5 is divided into left and right portions (as viewed in FIG. 3A) by a trench region 10 which is filled with silicon or silicon oxide so as to serve as a trench isolator. A source region 7 and a drain region 6 separated from the source region are formed in the left portion of the substrate with both in contact with the left side of the trench region 10 (as viewed in FIG. 3A). A control gate region 11, which may be highly doped N-type silicon, is formed in the portion of the substrate to the right of the trench region and contacts the side thereof opposite the source and drain regions. The space 14 between the source region 6 and the drain region 7, which are fabricated in much the same way as in a typical MOSFET, (FIG. 3B) forms the conduction channel.

A first thin oxide layer 12, which serves as a first gate oxide and also as an intergate oxide, is grown over the area of the substrate occupied by trench region 10, source region 7, drain region 6 and a portion of the exposed area of control gate region 11 (as seen in FIG. 3A). Then, a first polycrystalline silicon film 13 (poly-I), which serves as the floating gate, is formed over that portion of the area of oxide layer 12 which extends in one direction from the field oxide region 5 to the edge of layer 12 (FIG. 3A) and extends in the orthogonal direction between the drain region 6 and partially overlaps the source region 7 (FIG. 3B). A second insulating oxide layer 21 is then formed over the area covered by the poly-I film 13 and also over a portion of the control gate region 11 disposed adjacent the edge of the first oxide layer 12 (FIG. 3A). A second polycrystalline silicon layer 22 (poly-II) is then formed over the second oxide layer 21 and is electrically connected to the control gate region 11 at the buried contact 20 (FIG. 3A); by virtue of the contact between control gate region 11 and polycrystalline silicon layer 22, the poly-II layer 22 is caused to operate as the control gate. The device is completed by forming a film of borophospho-silicate glass 23 over the poly-II film.

The trench region 10 divides the substrate into two regions, with the control gate region 11 on one side of the trench and the separated source and drain regions 6 and 7 disposed on the opposite side. Consequently, an electric field produced by a positive potential applied to control gate region 11 would not affect the source and drain regions directly and electrons would not flow toward the control gate region. However, because the poly-II layer 22 electrically connected to the control gate region 11 in the substrate bridges the trench region and extends over the channel region that separates the source and drain regions, a positive voltage applied to poly-II layer 22 will produce an electric field between layer 22 and the substrate and cause electrons to gather in the channel between the drain and source. With the source grounded and high voltage applied to the control gate and drain, the electrons gain sufficient energy to jump the silicon-silicon dioxide energy barrier, penetrating the oxide layer 12 and flowing to floating gate 13. A portion of the voltage supplied to the control gate appears across insulating layer 21 and another portion appears across insulating layer 12 in accordance with their relative capacitances. Insulating layer 21 being quite thick compared to insulating layer 12, its capacitance is very much smaller than the capacitance of layer 12; accordingly, a larger portion of the voltage supplied to the gate appears across layer 12, thereby improving the coupling efficiency between the control gate and floating gate. The thinner the insulating layer 12 between the substrate and the floating gate the lower the control gate voltage required to program the cell; the thickness of insulating layer 21 between poly-II layer 22 and the floating gate has insignificant effect on the required control gate voltage.

Among the advantages of the described construction is that a high quality layer 12 can be formed between the substrate and the floating gate 13 by in situ thermal oxidation instead of by chemical vapor deposition. By virtue of the improved quality of the thermal oxide film, even when made very thin, it prevents leakage of charge from the floating gate. Also, because the programming voltage of the EPROM is not affected by its thickness, the insulating layer 21 between poly-II layer 22 and the floating gate can be made thicker without precise control of its thickness. Finally, because of the increased coupling efficiency between the control gate and floating gate, the cell can be programmed with lower drain and control gate voltages than prior art EPROMS.

Because the floating gate 13 is completely surrounded by the oxide films 12 and 21, once programmed the cell can hold its charge for a long period of time, measured in years. The injected electrons cause a 5–10 volts increase in the threshold level of the EPROM cell, and application of a 5 volts READ voltage to the control gate switches it from its "on" state to its "off" state. If there is reason to erase the information stored in the EPROM cell, the integrated circuit is removed from its socket and exposed to intense ultraviolet light for approximately 20 minutes; a transparent quartz window is preferably built into the top of the IC package for this purpose.

Figure 5A:
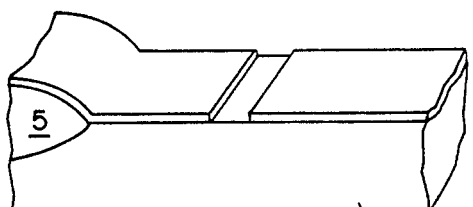
FIGS. 5A through 5R are enlarged diagrammatic perspective views which illustrate the steps involved in the fabrication of the improved EPROM cell.
Figure 5F:
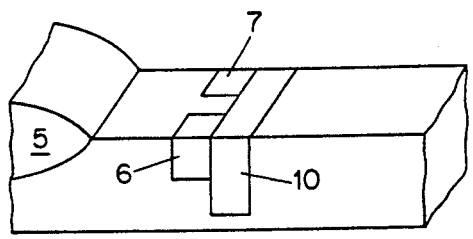
Figure 5B:
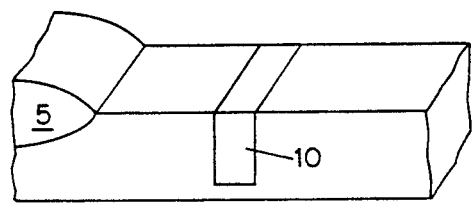
Figure 5G:
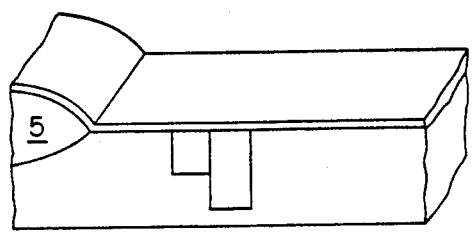
Figure 5C:
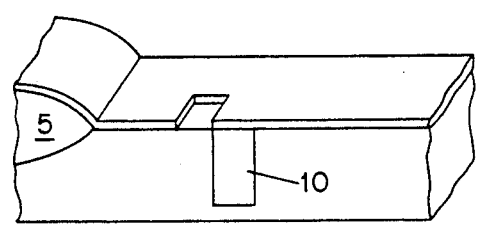
Figure 5H:
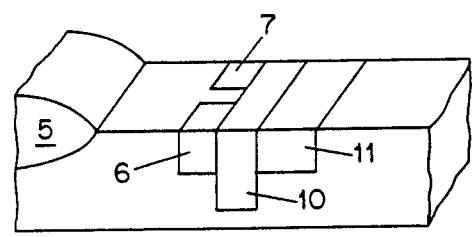
Figure 5D:
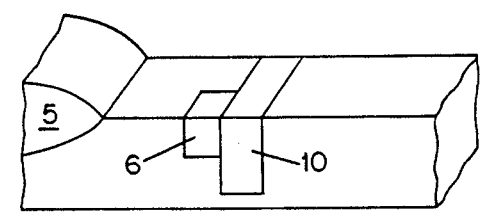
Figure 5I:
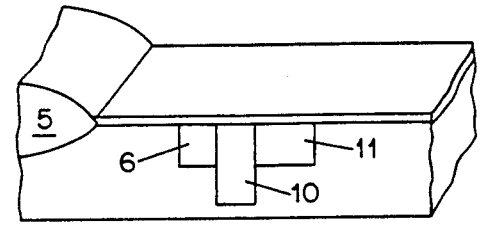
Figure 5E:
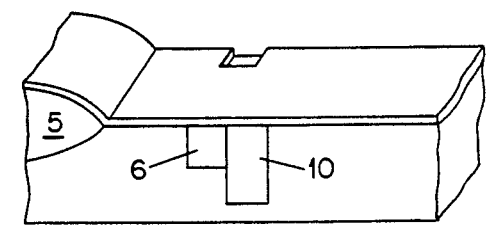
Figure 5J:
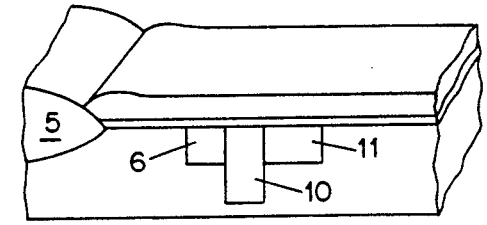
Figure 5K:
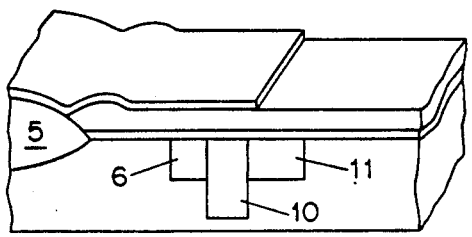
Figure 5O:
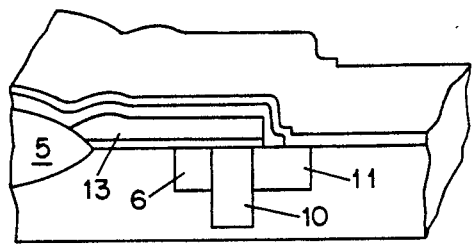
Figure 5L:
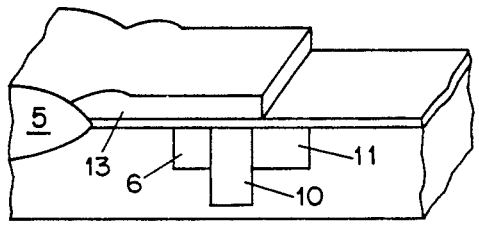
Figure 5P:
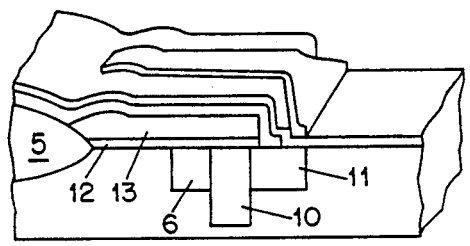
Figure 5M:
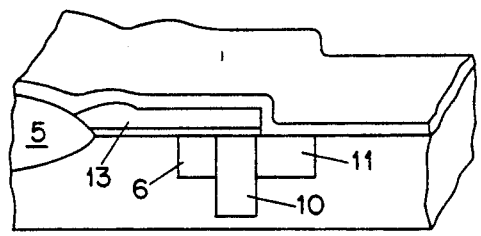
Figure 5Q:
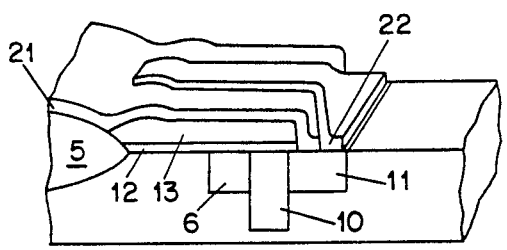
Figure 5N:
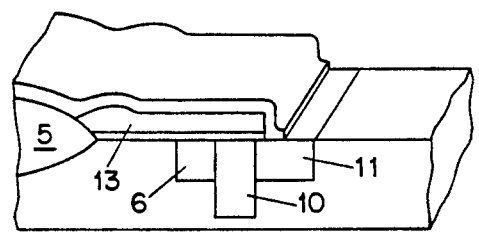
Figure 5R:
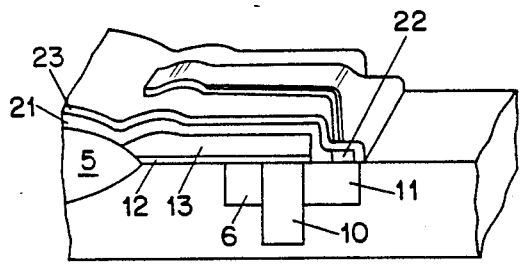

The EPROM cell according to the invention is fabricated in accordance with the manufacturing steps depicted in FIGS. 5A through 5R, each of which diagrammatically shows, greatly enlarged, a separate step in the fabrication of a single EPROM cell. Referring to FIG. 5A, following formation of the field oxide 5 in semiconductor substrate 1 by techniques well known in the fabrication of semiconductors, silicon oxide is deposited on the substrate and a photoresist patterned according to the trench pattern then deposited over the silicon oxide. The silicon oxide film and semiconductor substrate are then etched according to the pattern to form a trench. A film of silicon oxide is then deposited on the surfaces of the etched area of the trench region 10 and the trench then filled with silicon or silicon oxide, as shown in FIG. 5B.

The drain region 6 is formed in the substrate in contact with one side of the trench region by applying a silicon oxide film on the surface of the substrate and over that depositing a photoresist patterned according to the drain region. A part of the silicon oxide film is removed by etching according to the drain pattern (FIG. 5C) and phosphorous or arsenic is diffused through the removed part of the silicon oxide film into the substrate to form the drain region 6, shown in FIG. 5D.

The source region 7 is formed in the substrate on the same side of the trench as the drain region by depositing a silicon oxide film on the substrate over which photoresist patterned according to the source region is deposited. The part of the silicon oxide film corresponding to the source pattern is removed by etching (FIG. 5E) and through the remaining part of the silicon oxide film phosphorous or arsenic is diffused into the substrate to form the source region 7 (FIG. 5F).

The described method of forming the drain region 6 and the source region 7 on the semiconductor substrate is the same as that used to form the drain and source regions in the semiconductor substrate of a MOSFET. Here, however, the drain and source regions are both in contact with the trench region 10, and as a further departure, a control gate region 11 is formed in the substrate in contact with the side of the trench region which is opposite the source and drain regions. To form the control gate region, a silicon oxide film is deposited on the substrate over which a photoresist pattern according to the control gate region pattern is deposited. After a part of the silicon oxide film is removed from the patterned area, phosphorous or arsenic is diffused into the substrate to form the control gate region (FIGS. 5G and 5H).

As depicted in FIG. 5I, the first silicon oxide film 12 is formed on the upper surface of the semiconductor substrate and covers all of the elements previously formed in the substrate, namely, the drain region 6, the source region 7, the trench region 10 and the control gate region 11, and insulates the next-to-be formed floating gate 13 from the other regions in the substrate.

As shown in FIG. 5J, the poly-I layer 13 is formed over the silicon oxide film 12 by first depositing silicon oxide film on the surface of the silicon oxide film 12. A photoresist patterned to remove a part of the poly-I film is then deposited over the poly-I layer 13, and the poly-I is etched according to the masked pattern so as to leave a section of the poly-I layer which extends from the oxide field 5 across the source and drain regions, the trench region and a relatively short edge portion of the control gate region 11, as shown in FIG. 5L. The thus uncovered portion of the first oxide layer 12 is then stripped away so as to expose a major portion of the area of the control gate region 11. Thereafter, as depicted in FIG. 5M, a second silicon oxide film 21 is formed over poly-I layer 13 and the exposed area of the control gate region 11. Then, as shown in FIG. 5N, the right end portion of film 21 is stripped away so as to still expose a portion of the control gate region 11. This second silicon oxide layer completely covers the poly-I layer 13 and, as will be seen, serves as the interpoly oxide film.

Referring now to FIG. 5O, a poly-II film 22 is formed over the second silicon oxide film 21 and also over that portion of the semiconductor substrate which extends beyond the right-hand edge of film 21 and is electrically connected to the control gate region 11 at a buried contact 20. The part of poly-II film 22 that extends to the right from the outermost edge of the gate control region 11 is removed by photoresist patterning and etching to remove the unwanted portion of the poly-II film. Also, as shown in FIGS. 5P and 5Q, edge portions of the poly-II film 22 that overlies the insulating layer 21 are etched away to form a film of strap-like shape which extends from the point where it makes electrical contact with the control gate region 11 at buried contact 20, and across the channel formed between the source region 7 and drain region 6. As shown in FIG. 5R, the cell is completed by forming a film of glass 23, preferably boro-phospho-silicate glass, on poly-II film 22.

I claim:

1. A method for manufacturing an EPROM cell in a semiconductor substrate, comprising the steps of:
    (a) etching said semiconductor substrate to form a trench region therein having first and second side surfaces and dividing said semiconductor substrate into first and second portions adjacent said first and second side surfaces, respectively;
    (b) filling said trench region with a trench-filler material;
    (c) forming in said first portion of said semiconductor substrate a drain region and a source region separated from one another and both in contact with said first side surface of said trench region;
    (d) forming a control gate region in said second portion of said semiconductor substrate in contact with said second side surface of said trench region and separated from said source region by said trench region;
    (e) forming a first film of electrical insulating material over and covering said drain region, said source region and a portion of said control gate region that is disposed adjacent said second side surface of said trench region;
    (f) forming a first polycrystalline silicon film over and covering at least that portion of said first insulating film that is disposed above said source region to serve as a floating gate;
    (g) forming a second film of electrical insulating material over and covering said first polycrystalline silicon film; and
    (h) forming a second polycrystalline silicon film over and covering at least partially said second film of electrical insulating material and electrically connected to a portion of said control gate region not covered by said first film of electrical insulating material to provide electrically interconnected control gate regions disposed both above and below said floating gate.

2. The method according to claim 1, comprising the further step of covering the surfaces of said trench region with a trench-insulation film before filling the trench region with trench-filler material.

3. The method according to claim 2, wherein said trench-insulation film is an oxide film formed in a surface of said trench region and wherein said trench-filler material includes a silicon oxide.

4. The method according to claim 1, wherein said trench-filler material includes a silicon oxide.

* * * * *